(12) United States Patent
Lv

(10) Patent No.: US 12,598,735 B2
(45) Date of Patent: Apr. 7, 2026

(54) SEMICONDUCTOR STRUCTURE AND MANUFACTURING METHOD THEREOF

(71) Applicants: CHANGXIN MEMORY TECHNOLOGIES, INC., Hefei City (CN); CHANGXIN JIDIAN (BEIJING) MEMORY TECHNOLOGIES CO., LTD., Beijing (CN)

(72) Inventor: Zhaohong Lv, Hefei City (CN)

(73) Assignees: CHANGXIN MEMORY TECHNOLOGIES, INC., Hefei City (CN); Changxin Jidian (Beijing) Memory Technologies Co., Ltd., Beijing (CN)

( * ) Notice: Subject to any disclaimer, the term of this patent is extended or adjusted under 35 U.S.C. 154(b) by 511 days.

(21) Appl. No.: 18/152,224

(22) Filed: Jan. 10, 2023

(65) Prior Publication Data

US 2023/0363141 A1    Nov. 9, 2023

(30) Foreign Application Priority Data

May 5, 2022    (CN) .......................... 202210477711.2

(51) Int. Cl.
H10B 12/00         (2023.01)
(52) U.S. Cl.
CPC ............. H10B 12/30 (2023.02); H10B 12/05 (2023.02)

(58) Field of Classification Search
None
See application file for complete search history.

(56) References Cited

U.S. PATENT DOCUMENTS

| | | | | |
|---|---|---|---|---|
| 6,093,612 | A | * | 7/2000 | Suh ....................... H10D 64/259 |
| | | | | 438/303 |
| 6,225,669 | B1 | * | 5/2001 | Long .................... H10D 64/516 |
| | | | | 257/547 |
| 2005/0087775 | A1 | | 4/2005 | Chen et al. |
| 2018/0151690 | A1 | * | 5/2018 | Han ....................... H10D 30/62 |

* cited by examiner

*Primary Examiner* — Nilufa Rahim
(74) *Attorney, Agent, or Firm* — Syncoda LLC; Feng Ma

(57) ABSTRACT

The present disclosure provides a semiconductor structure and a manufacturing method thereof, and relates to the technical field of semiconductors. The semiconductor structure includes: a substrate, a first dielectric layer, a second dielectric layer, and a gate structure, where an active region is provided in the substrate, and a source region of a first doping type and a drain region of the first doping type are disposed in the active region; the first dielectric layer is disposed on the substrate and covers a part of the source region and/or a part of the drain region; the second dielectric layer is disposed on the substrate and connected to the first dielectric layer, a dielectric constant of the second dielectric layer is greater than a dielectric constant of the first dielectric layer.

8 Claims, 7 Drawing Sheets

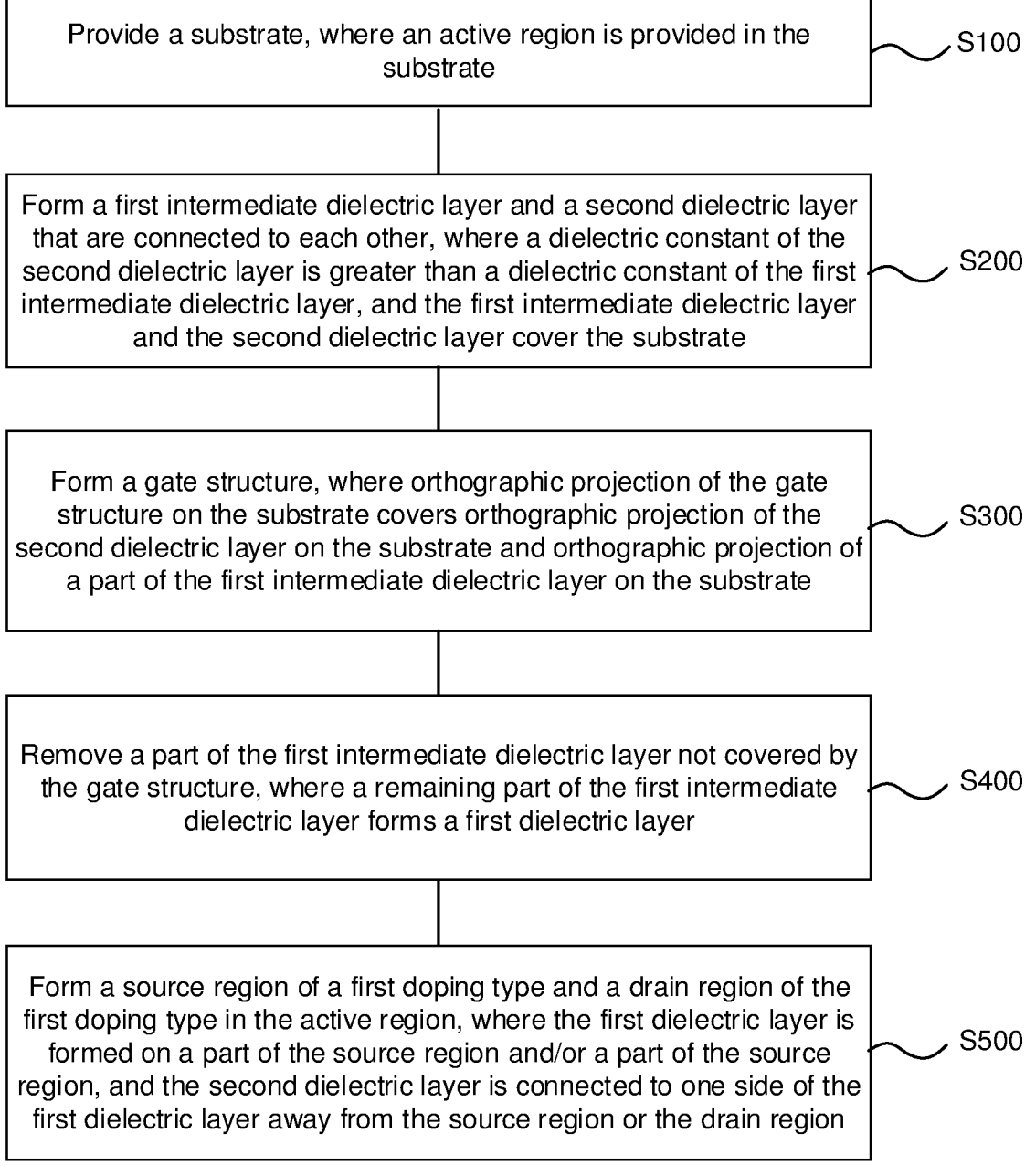

Provide a substrate, where an active region is provided in the substrate    S100

Form a first intermediate dielectric layer and a second dielectric layer that are connected to each other, where a dielectric constant of the second dielectric layer is greater than a dielectric constant of the first intermediate dielectric layer, and the first intermediate dielectric layer and the second dielectric layer cover the substrate    S200

Form a gate structure, where orthographic projection of the gate structure on the substrate covers orthographic projection of the second dielectric layer on the substrate and orthographic projection of a part of the first intermediate dielectric layer on the substrate    S300

Remove a part of the first intermediate dielectric layer not covered by the gate structure, where a remaining part of the first intermediate dielectric layer forms a first dielectric layer    S400

Form a source region of a first doping type and a drain region of the first doping type in the active region, where the first dielectric layer is formed on a part of the source region and/or a part of the source region, and the second dielectric layer is connected to one side of the first dielectric layer away from the source region or the drain region    S500

FIG. 3

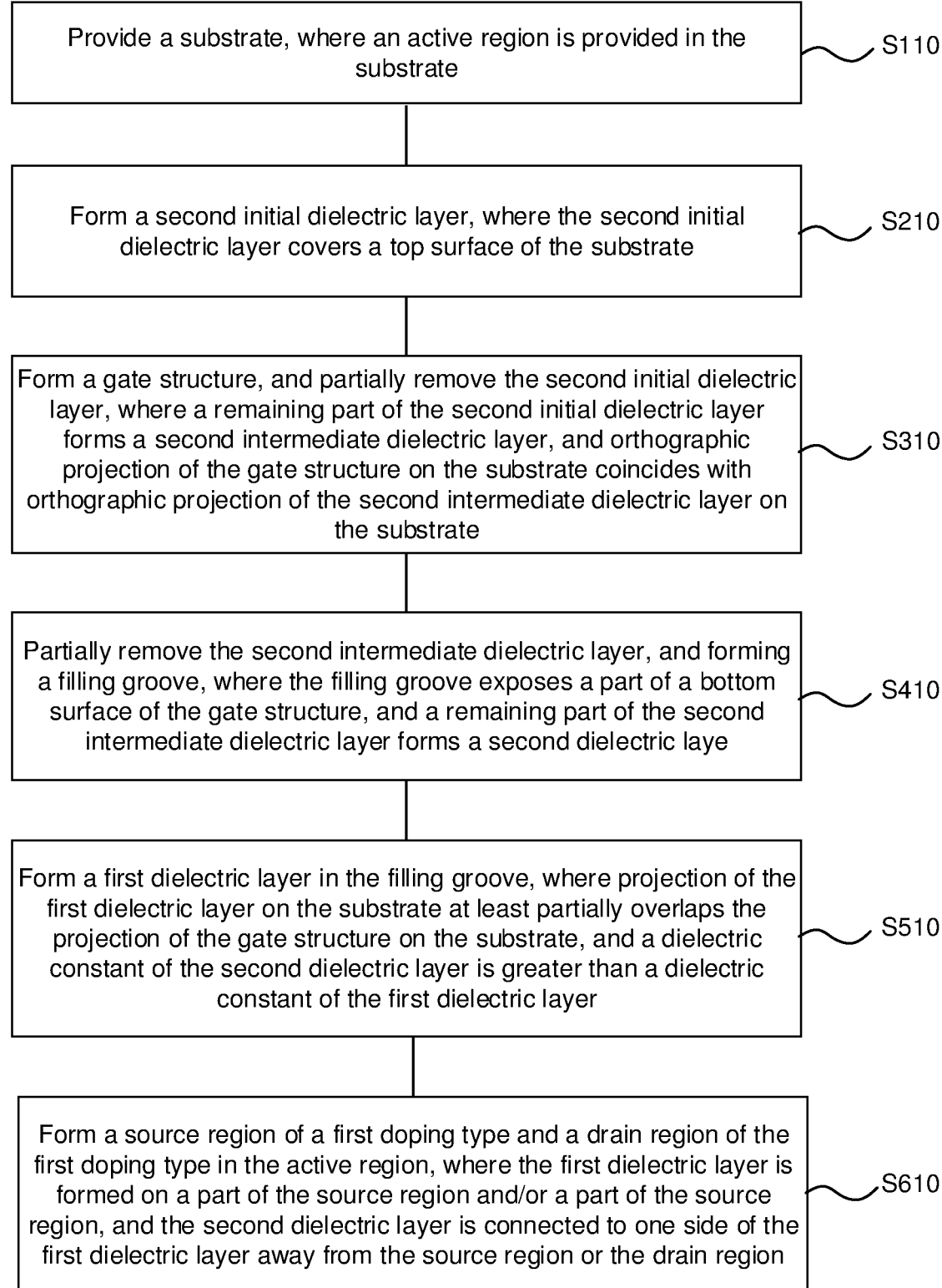

Provide a substrate, where an active region is provided in the substrate ~ S110

Form a second initial dielectric layer, where the second initial dielectric layer covers a top surface of the substrate ~ S210

Form a gate structure, and partially remove the second initial dielectric layer, where a remaining part of the second initial dielectric layer forms a second intermediate dielectric layer, and orthographic projection of the gate structure on the substrate coincides with orthographic projection of the second intermediate dielectric layer on the substrate ~ S310

Partially remove the second intermediate dielectric layer, and forming a filling groove, where the filling groove exposes a part of a bottom surface of the gate structure, and a remaining part of the second intermediate dielectric layer forms a second dielectric laye ~ S410

Form a first dielectric layer in the filling groove, where projection of the first dielectric layer on the substrate at least partially overlaps the projection of the gate structure on the substrate, and a dielectric constant of the second dielectric layer is greater than a dielectric constant of the first dielectric layer ~ S510

Form a source region of a first doping type and a drain region of the first doping type in the active region, where the first dielectric layer is formed on a part of the source region and/or a part of the source region, and the second dielectric layer is connected to one side of the first dielectric layer away from the source region or the drain region ~ S610

FIG. 8

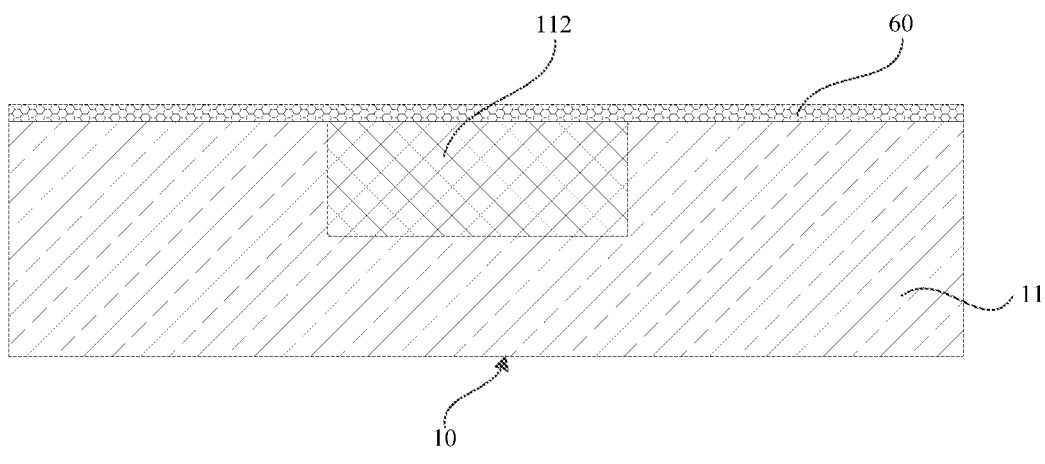
FIG. 9
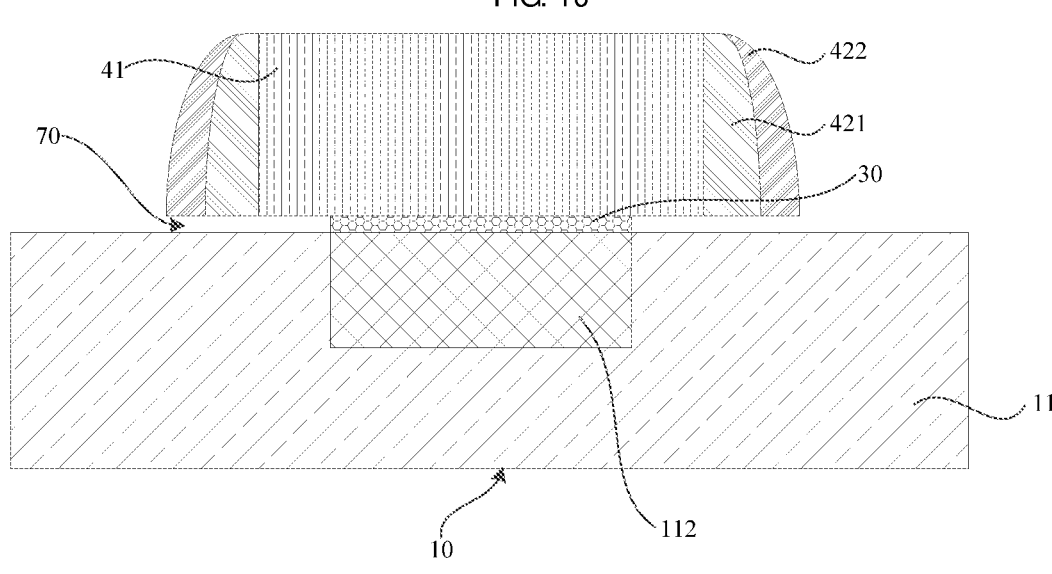
FIG. 10
FIG. 11

SEMICONDUCTOR STRUCTURE AND MANUFACTURING METHOD THEREOF

CROSS-REFERENCE TO RELATED APPLICATION

This application claims the priority of Chinese Patent Application No. 202210477711.2, submitted to the Chinese Intellectual Property Office on May 5, 2022, the disclosure of which is incorporated herein in its entirety by reference.

TECHNICAL FIELD

The present disclosure relates to the technical field of semiconductors, but is not limited to a semiconductor structure and a manufacturing method thereof.

BACKGROUND

The dynamic random access memory (DRAM) has advantages of a small size, a high degree of integration, and low power consumption, and the access speed of a DRAM chip is faster than that of the read-only memory (ROM).

In the DRAM chip, the shortest time taken to read the chip data is one of the core indicators of the chip. This time reflects the response speed of the chip, and a smaller value is preferred. The time is related to electrical parameters in the semiconductor structure, such as the parasitic capacitance of the overlapping region between a gate structure in the semiconductor structure and the source region in the active region, and the parasitic capacitance of the overlapping region between the gate structure and the drain region in the active region.

SUMMARY

An overview of the subject described in detail in the present disclosure is provided below. This overview is not intended to limit the protection scope of the claims.

The present disclosure provides a semiconductor structure and a manufacturing method thereof.

A first aspect of the present disclosure provides a semiconductor structure, including:

a substrate, where an active region is provided in the substrate, and a source region of a first doping type and a drain region of the first doping type are disposed in the active region;

a first dielectric layer disposed on the substrate and covering a part of the source region and/or a part of the drain region;

a second dielectric layer disposed on the substrate, where the first dielectric layer is connected to the second dielectric layer, and a dielectric constant of the second dielectric layer is greater than a dielectric constant of the first dielectric layer; and a gate structure, where orthographic projection of the gate structure on the substrate covers orthographic projections of the second dielectric layer and the first dielectric layer on the substrate.

A second aspect of the present disclosure provides a method of manufacturing a semiconductor structure, including:

providing a substrate, where an active region is provided in the substrate;

forming a first intermediate dielectric layer and a second dielectric layer that are connected to each other, where a dielectric constant of the second dielectric layer is greater than a dielectric constant of the first intermediate dielectric layer, and the first intermediate dielectric layer and the second dielectric layer cover the substrate;

forming a gate structure, where orthographic projection of the gate structure on the substrate covers orthographic projection of the second dielectric layer on the substrate and orthographic projection of a part of the first intermediate dielectric layer on the substrate;

removing a part of the first intermediate dielectric layer not covered by the gate structure, where a remaining part of the first intermediate dielectric layer forms a first dielectric layer; and forming a source region of a first doping type and a drain region of the first doping type in the active region, where the first dielectric layer is formed on a part of the source region and/or a part of the drain region, and the second dielectric layer is connected to one side of the first dielectric layer away from the source region or the drain region.

A third aspect of the present disclosure provides a method of manufacturing a semiconductor structure, including:

providing a substrate, where an active region is provided in the substrate;

forming a second initial dielectric layer, where the second initial dielectric layer covers a top surface of the substrate;

forming a gate structure, and partially removing the second initial dielectric layer, where a remaining part of the second initial dielectric layer forms a second intermediate dielectric layer, and orthographic projection of the gate structure on the substrate coincides with orthographic projection of the second intermediate dielectric layer on the substrate;

partially removing the second intermediate dielectric layer, and forming a filling groove, where the filling groove exposes a part of a bottom surface of the gate structure, and a remaining part of the second intermediate dielectric layer forms a second dielectric layer;

forming a first dielectric layer in the filling groove, where projection of the first dielectric layer on the substrate at least partially overlaps the projection of the gate structure on the substrate, and a dielectric constant of the second dielectric layer is greater than a dielectric constant of the first dielectric layer; and forming a source region of a first doping type and a drain region of the first doping type in the active region, where the first dielectric layer is formed on a part of the source region and/or a part of the drain region, and the second dielectric layer is connected to one side of the first dielectric layer away from the source region or the drain region.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

FIG. 3 is a flowchart of a method of manufacturing a semiconductor structure according to an exemplary embodiment;

FIG. 8 is a flowchart of the method of manufacturing a semiconductor structure according to an exemplary embodiment;

FIG. 9 is a schematic diagram of forming a second initial dielectric layer in the method of manufacturing a semiconductor structure according to an exemplary embodiment;

FIG. 10 is a schematic diagram of forming a gate layer in the method of manufacturing a semiconductor structure according to an exemplary embodiment;

FIG. 11 is a schematic diagram of forming a protection structure and a filling groove in the method of manufacturing a semiconductor structure according to an exemplary embodiment;

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

The DRAM has advantages of a small size, a high degree of integration, and low power consumption, and the access speed of a DRAM chip is faster than that of the ROM.

In the DRAM chip, the shortest time taken to read the chip data is one of the core indicators of the chip. The response speed of the chip is reflected by this time, that is, the time that the DRAM chip takes to output the read data to a controller, after the DRAM chip receives a read command from the controller. A smaller value is better. The time is related to electrical parameters in the semiconductor structure of a core circuit in the DRAM chip. For example, if the parasitic capacitance of the overlapping region between a gate structure in the semiconductor structure and the source region in the active region, and the parasitic capacitance of the overlapping region between the gate structure and the drain region in the active region are smaller, the foregoing time is shortest.

According to an exemplary embodiment, this embodiment provides a semiconductor structure, which is described with reference to FIGS. 1 and 2.

The semiconductor structure is not limited in this embodiment. Description is made by using an example in which the semiconductor structure is a transistor in the core region of the DRAM, but this embodiment is not limited thereto. Alternatively, the semiconductor structure in this embodiment may be another structure.

Figure 1:
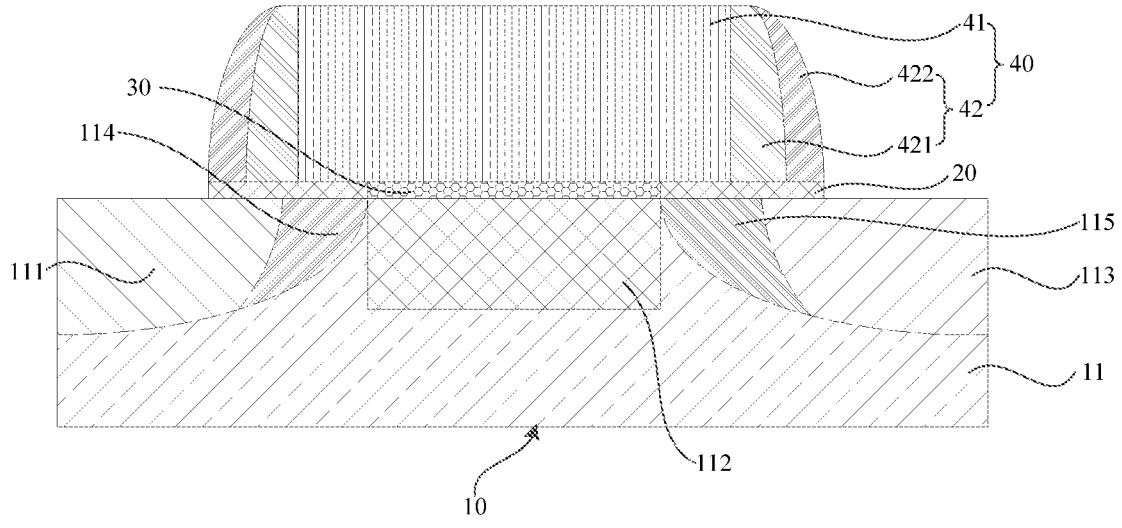
FIG. 1 is a schematic diagram of a semiconductor structure according to an exemplary embodiment.
Figure 2:
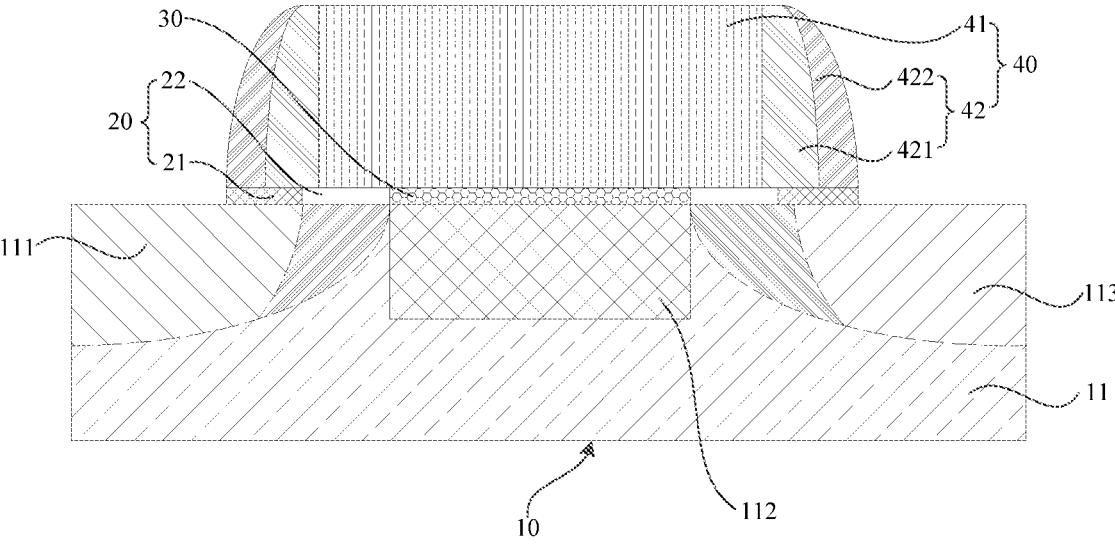
FIG. 2 is a schematic diagram of a semiconductor structure according to an exemplary embodiment.

As shown in FIGS. 1 and 2, the semiconductor structure in this embodiment includes a substrate 10, a first dielectric layer 20, a second dielectric layer 30 and a gate structure 40.

The substrate 10 is used as a support component of the DRAM to support other components provided thereon. For example, the substrate 10 may be provided with structures such as a word line structure and a bit line structure. The substrate 10 may be made of a semiconductor material. The semiconductor material may be one or more of silicon, germanium, a silicon-germanium compound, and a silicon-carbon compound. In this embodiment, the substrate 10 is made of silicon, to facilitate the understanding of the subsequent forming method by those skilled in the art, rather than to constitute a limitation.

An active region 11 is provided in the substrate 10, and a source region 111 of a first doping type and a drain region 113 of the first doping type are disposed at intervals in the active region 11. The substrate 10 may be a P-type substrate, and the first-type doping is performed on a part of the substrate 10 to form the source region 111 and the drain region 113. For example, N-type doping may be performed on the source region 111 and the drain region 113 to form a negative channel-metal-oxide-semiconductor (NMOS). For example, the source region 111 and the drain region 113 may be doped with an n-type doping material, such that an n-type semiconductor is formed in the source region 111 and the drain region 113. The N-type doping material may be an element in the IV main group of the periodic table such as phosphorus (P), or a material of another element. This is not listed herein. In an example, phosphorus ions may be implanted into the source region 111 and the drain region 113. Certainly, the source region 111 and/or the drain region 113 may further be doped by other processes. This is not specifically limited herein.

With reference to FIGS. 1 and 2, the substrate 10 further includes a channel region 112 of a second doping type. The current can flow in the channel region 112. The gate structure 40 controls the current in the channel region 112 by using the potential. The channel region 112 is located below the gate structure 40, and two ends of the channel region 112 are respectively connected to the source region 111 and the drain region 113, and the second dielectric layer 30 covers the channel region 112.

The dopant ions of the second doping type are different from the doping ions of the first doping type, or they are opposite. Doping ions may be understood as doping P-type ions and N-type ions, that is, P-type ions and N-type ions corresponding to doping group III elements and group V elements respectively. Whether the ions of the first doping type are P-type ions or N-type ions is consistent with the property of field effect transistors. That is, the ions of the first doping type of NMOS are N-type ions, and the ions of the first doping type of a positive channel-metal-oxide-semiconductor (PMOS) are P-type ions.

Specifically, when the substrate 10 is a P-type silicon substrate, that is, N-type ions (group V element ions such as phosphorus (P) or arsenic (As)) are implanted into the silicon substrate to form the active region 11, the ions of the first doping type are N-type ions, and the ions of the second doping type are P-type ions (group III element ions such as boron (B) or gallium (Ga)).

When the substrate 10 is an N-type silicon substrate, that is, the active region 11 is formed by implanting P-type ions (group III element ions such as B or Ga) into the silicon substrate, the ions of the first doping type are P-type ions, and the ions of the second doping type are N-type ions (V group element ions such as P or As).

In some embodiments, as shown in FIGS. 1 and 2, the substrate 10 further includes a first source subregion 114 of the first doping type and/or a first drain subregion 115 of the first doping type therein. The first source subregion 114 is located at one side of the source region 111 and close to the drain region 113, the first drain subregion 115 is located at one side of the drain region 113 and close to the source region 111, a dopant ion concentration of the first source subregion 114 is smaller than that of the source region 111, and a dopant ion concentration of the first drain subregion 115 is smaller than that of the drain region 113. The first source subregion 114 is located between the source region 111 and the channel region 112. The first source subregion 114 can effectively weaken the electric field of the source region 111 and improve the hot electron degradation phenomenon of the source region 111. Similarly, the first drain subregion 115 is located between the drain region 113 and the channel region 112, the first drain subregion 115 can effectively weaken the electric field of the drain region 113 and improve the hot electron degradation phenomenon of the drain region 113.

In this embodiment, the arrangement of the first source subregion and/or the first drain subregion can effectively reduce the leakage current problem caused by thermal electron degradation between the source region and/or the drain region and the gate structure, thereby ensuring the stability of the transistor structure.

With reference to FIG. 1, the first dielectric layer 20 is disposed on a part of the source region 111 and a part of the drain region 113. The first dielectric layer 20 is disposed close to the channel region 112, but is not limited to the channel region 112. In other words, the first dielectric layer 20 covers a part of the source region 111 and a part of the drain region 113 that are close to the channel region 112.

The second dielectric layer 30 is disposed over the channel region 112 and covers the top surface of the channel region 112. With reference to FIG. 1, the second dielectric layer 30 covers the entire channel region 112, and the second dielectric layer 30 is made of a material with a dielectric constant greater than or equal to 3.9, which does not affect the ability of the semiconductor structure to control the channel region. The first dielectric layer 20 and the second dielectric layer 30 are connected to form the entire dielectric layer, and the second dielectric layer 30 divides the first dielectric layer 20 into two segments. The two segments of the first dielectric layer 20 are located at both sides of the second dielectric layer 30. The dielectric constant of the second dielectric layer 30 is greater than the dielectric constant of the first dielectric layer 20.

In an example, as shown in FIG. 2, the first dielectric layer 20 includes a first dielectric sublayer 21 and an air gap 22.

The first dielectric sublayer 21 is located under the protection structure 42, and the air gap 22 is located between the first dielectric sublayer 21 and the second dielectric layer 30. The first dielectric sublayer 21 is made of a low-K material of which a dielectric constant lower than or equal to 3. In this case, the air gap 22 is also provided in the first dielectric layer 20, which can effectively reduce the parasitic capacitance of the overlapping region between the gate structure 40 and the source region 111 and/or the overlapping region between the gate structure 40 and the drain region 113, thereby minimizing the time for the semiconductor structure to read data, and improving the electrical property of the semiconductor structure.

The gate structure 40 covers the top surface of the second dielectric layer 30 and the top surface of the first dielectric layer 20. With reference to FIG. 1, taking a plane parallel to the top surface of the substrate 10 as a cross section, the projection area of the cross section of the gate structure 40 on the substrate 10 is larger than that of the second dielectric layer 30 on the substrate 10, and an edge of the orthographic projection of the cross section of the gate structure 40 on the substrate 10 covers the top surface of the first dielectric layer 20.

The following calculation formula of the plate capacitance is used: $C=\varepsilon S/d$, where a unit of a capacitance value C is F, $\varepsilon$ is a dielectric constant of the dielectric layer, and S an area of the overlapping region between the gate structure and the source region or of the overlapping region between the gate structure and the drain region, and d is a vertical distance between the gate structure and the source region or between the gate structure and the drain region. Because the dielectric constant $\varepsilon_2$ of the second dielectric layer 30 is greater than the dielectric constant $\varepsilon_1$ of the first dielectric layer 20, when the overlapping area S and the vertical spacing d remain unchanged, the value of the parasitic capacitance of the overlapping region between the gate structure 40 and the source region 111 and/or the value of the parasitic capacitance of the overlapping region between the gate structure 40 and the drain region 113 are/is reduced.

In this embodiment, the dielectric layer in the overlapping region between the gate structure and the source region, and the dielectric layer in the overlapping region between the gate structure and the drain region are designed to be the first dielectric layer and the second dielectric layer that have different dielectric constants. The dielectric constant of the second dielectric layer is greater than that of the first dielectric layer. This effectively reduces a parasitic capacitance of an overlapping region between the gate structure and the source region and/or a parasitic capacitance of an overlapping region between the gate structure and the drain region, minimizes the time for the semiconductor structure to read data, and improves the electrical property of the semiconductor structure.

In some embodiments, the dielectric constant of the first dielectric layer 20 is smaller than or equal to 3. For example, the first dielectric layer 20 may be made of a low-K material. The low-K material may include, but is not limited to silicon nitride, silicon nitride carbide, and the like, or the first dielectric layer 20 may further include air gaps. When the dielectric constant of the first dielectric layer 20 is smaller than or equal to 3, there is a difference between the dielectric constant of the first dielectric layer 20 and the dielectric constant of the second dielectric layer 30, thereby reducing a parasitic capacitance of an overlapping region between the gate structure and the source region and/or a parasitic capacitance of an overlapping region between the gate structure and the drain region, minimizing the time for the semiconductor structure to read data, and improving the electrical property of the semiconductor structure.

In some embodiments, the dielectric constant of the second dielectric layer 30 is greater than or equal to 3.9. For example, the second dielectric layer 30 may be made of a high-K material or a material with a dielectric constant greater than or equal to 3.9. The high-K material may be, for example, one of zirconium oxide (ZrOx), hafnium oxide (HfOx), titanium zirconium oxide (ZrTiOx), ruthenium oxide (RuOx), aluminum oxide (AlOx), or a combination thereof. That is to say, the material of the dielectric layer may be one of the above materials, or may also be a combination or a mixture of the above materials.

In this embodiment, an example is made in which a dielectric constant K2 of the second dielectric layer 30 is 3.9, and a dielectric constant K1 of the first dielectric layer 20 is 2.5. According to the calculation formula of the plate capacitance, under the condition that the overlapping area S and the vertical spacing d remain unchanged, the parasitic capacitance of the overlapping region between the gate structure 40 and the source region 111 and the parasitic capacitance of the overlapping region between the gate structure 40 and the drain region 113 are reduced. According to the following formula: $(1-K1/K2)\times100\%$, the foregoing parasitic capacitance is reduced by 35.8%, thereby minimizing the time for the semiconductor structure to read data, and improving the electrical property of the semiconductor structure.

In this embodiment, the second dielectric layer may be made of a high-K material or a material with a dielectric constant greater than or equal to 3.9. The high-K material is beneficial to improving the equivalent capacitance value per unit area of the subsequently formed semiconductor structure, and increasing the physical thickness of the subsequently formed semiconductor structure, thereby improving the performance of the semiconductor structure.

In some embodiments, as shown in FIGS. 1 and 2, the first dielectric layer 20 is as thick as the second dielectric layer 30. Thus, the first dielectric layer 20 and the second dielectric layer 30 that are made of different dielectric constant materials may be deposited by using the same deposition process parameters, thereby reducing the manufacturing process difficulty of the semiconductor structure, and saving the manufacturing cycles and costs of the semiconductor structure.

In some embodiments, as shown in FIGS. 1 and 2, the gate structure 40 includes a gate layer 41 and a protection structure 42. The gate layer 41 is disposed above the second dielectric layer 30 and covers the top surface of the second dielectric layer 30, and an overlapping region exists between the projection of the gate layer 41 on the substrate and the projection of the first dielectric layer 20 on the substrate. In other words, with reference to FIG. 1, the gate layer 41 is longer than the second dielectric layer 30 along the lateral direction shown in the drawing. The protection structures 42 are disposed at both sidewalls of the gate layer 41. The outer edge of the protection structure 42 is flush with the outer edge of the first dielectric layer 20.

In this embodiment, the gate layer may be configured to form a gate of a semiconductor structure such as a gate in a transistor, and the protection structure is configured to isolate and protect the sidewall of the gate layer. The protection structure may include a low-K material to reduce parasitic capacitance between the gate layer 41 and a side structure (for example, a contact plug), thereby improving the electrical property of the semiconductor structure.

In some embodiments, as shown in FIGS. 1 and 2, the protection structure 42 includes an isolation layer 421 and a protective layer 422. The isolation layer 421 is disposed on the sidewall of the gate layer 41 and covers the sidewall of the gate layer 41. In an example, the isolation layer 421 may be a single-layer structure, to ensure the isolation function of the gate layer 41 and reduce the difficulty of the process. In another example, the isolation layer 421 may be a laminated structure. For example, the isolation layer 421 includes a first isolation layer, a second isolation layer, and a third isolation layer (not shown in the figure). The three isolation layers may be made of a same material or not. For example, the materials of the three layers may include isolation materials such as silicon dioxide and a borophosphosilicate glass to isolate the gate layer 41. In another example, the first isolation layer, the second isolation layer and the third isolation layer may include silicon nitride or silicon oxynitride, to improve the isolation performance of the isolation layer 421 and facilitate selective etching in subsequent structures. Alternatively, the first isolation layer, the second isolation layer, and the third isolation layer may be made of a low-K material, and/or air gaps may be formed in the first isolation layer, the second isolation layer, and the third isolation layer, to reduce the parasitic capacitance between the gate layer 41 and the side structure (for example, a contact plug).

The protective layer 422 is disposed on the sidewall of the isolation layer 421 and covers the sidewall of the isolation layer 421, to protect the outer sidewall of the isolation layer 421 and the gate layer 41, and avoid a damage on the gate layer 41 caused by the processes such as the subsequent etching, thereby effectively ensuring the electrical property of the semiconductor structure. The outer sidewall of the protective layer 422 is arc-shaped. The outer sidewall of the arc structure can improve the fault tolerance rate in the subsequent etching process and ensure the performance of the semiconductor structure. The outer edge of the bottom wall of the protective layer 422 is flush with the side wall of the first dielectric layer 20 to ensure the formation quality of the gate structure and improve the performance of the gate structure.

According to an exemplary embodiment, this embodiment provides a method of manufacturing a semiconductor structure. As shown in FIG. 3, the method of manufacturing a semiconductor structure includes:

Step S100: Provide a substrate, where an active region is provided in the substrate.

Step S200: Form a first intermediate dielectric layer and a second dielectric layer that are connected to each other, where a dielectric constant of the second dielectric layer is greater than that of the first intermediate dielectric layer, and the first intermediate dielectric layer and the second dielectric layer cover the substrate.

Step S300: Form a gate structure, where orthographic projection of the gate structure on the substrate covers orthographic projection of the second dielectric layer and orthographic projection of a part of the first intermediate dielectric layer on the substrate.

Step S400: Remove a part of the first intermediate dielectric layer not covered by the gate structure, where a remaining part of the first intermediate dielectric layer forms a first dielectric layer.

Step S500: Form a source region of a first doping type and a drain region of the first doping type in the active region, where the first dielectric layer is formed on a part of the source region and/or a part of the drain region, and the second dielectric layer is connected to one side of the first dielectric layer away from the source region or the drain region.

Figure 4:
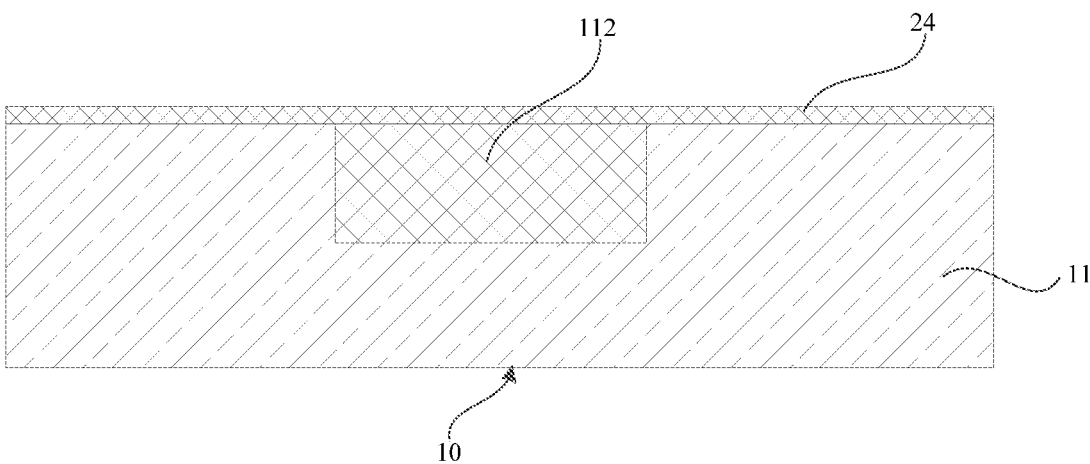
FIG. 4 is a schematic diagram of forming a first initial dielectric layer in the manufacturing method of a semiconductor structure according to an exemplary embodiment.

In step S100, as shown in FIG. 4, a plurality of active regions 11 are disposed in the substrate 10. The adjacent active regions 11 are separated by using a shallow trench isolation structure (not shown in the figure). A channel region 112 may be provided in each active region 11.

In this embodiment, a second dielectric layer is disposed between the gate structure and the substrate, where the gate structure also covers the first dielectric layer. The dielectric constant of the second dielectric layer is set to be greater than the dielectric constant of the first dielectric layer, thereby reducing a parasitic capacitance of an overlapping region between the gate structure and the source region and/or a parasitic capacitance of an overlapping region between the gate structure and the drain region, minimizing the time for the semiconductor structure to read data, and improving the electrical property of the semiconductor structure.

According to an exemplary embodiment, this embodiment is a further description of step S200.

In this embodiment, the first intermediate dielectric layer 25 and the second dielectric layer 30 that are connected to each other may be formed by using the following method.

First, as shown in FIG. 4, a first initial dielectric layer 24 is formed on the substrate 10 through an atomic layer deposition process, a physical vapor deposition process, or a chemical vapor deposition process. The first initial dielectric layer 24 covers the substrate 10. The dielectric constant of the material of the first initial dielectric layer 24 is smaller than or equal to 3. For example, the material of the first initial dielectric layer 24 may include low-K materials, such as silicon nitride and silicon nitride carbide.

Then, after the first initial dielectric layer 24 is formed, a mask layer (not shown in the figure) and a photoresist layer (not shown in the figure) are formed on the first initial dielectric layer 24 through the atomic layer deposition process, physical vapor deposition process, or chemical vapor deposition process. A mask pattern is formed on the photoresist layer through exposure or development and etching. The photoresist layer with the mask pattern is used as a mask, to remove a part of the first initial dielectric layer 24 through etching, thereby forming an opening 50 (with reference to FIG. 5) on the first initial dielectric layer 24, and the opening 50 exposes a part of the substrate 10. A remaining part of the first initial dielectric layer 24 forms a first intermediate dielectric layer 25.

Figure 5:
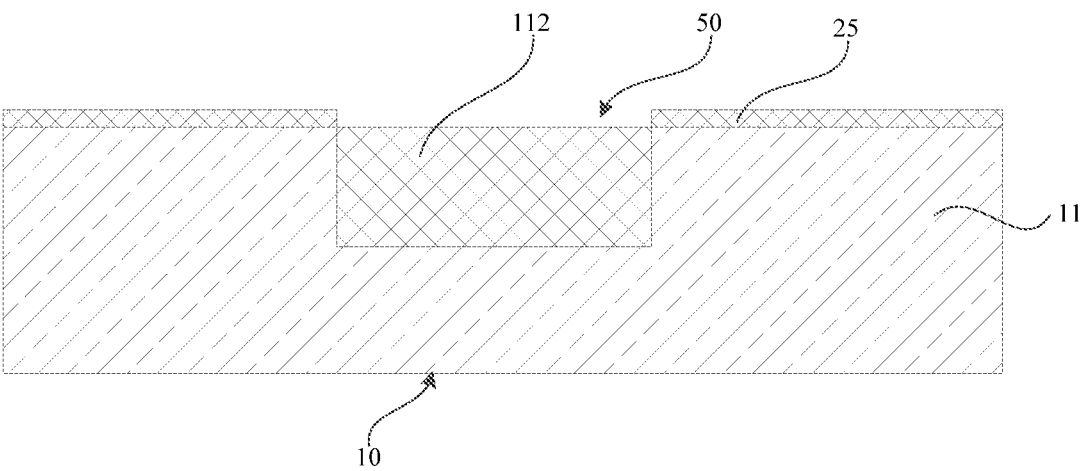
FIG. 5 is a schematic diagram of forming an opening in the method of manufacturing a semiconductor structure according to an exemplary embodiment.
Figure 6:
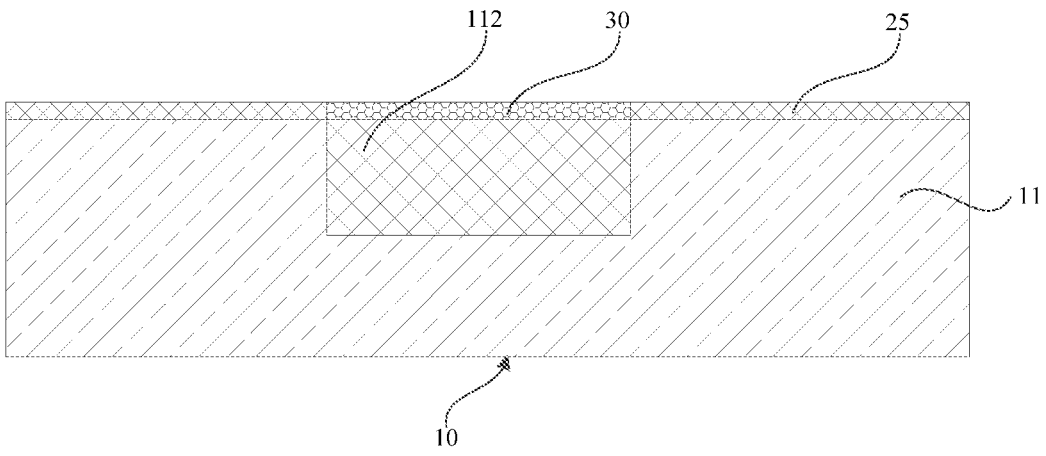
FIG. 6 is a schematic diagram of forming a second dielectric layer in the method of manufacturing a semiconductor structure according to an exemplary embodiment.

Then, as shown in FIGS. 5 and 6, a second dielectric layer 30 is deposited in the opening 50 through the atomic layer deposition process, physical vapor deposition process, or chemical vapor deposition process. The top surface of the second dielectric layer 30 may be made flush with the top surface of the first dielectric layer 20 by controlling the same deposition parameters or by using chemical mechanical polishing. The dielectric constant of the material of the second dielectric layer 30 is greater than or equal to 3.9. For example, the material of the second dielectric layer 30 may be a high-K material.

In this embodiment, a first initial dielectric layer is formed first, and based on the first initial dielectric layer, an opening corresponding to the position of the second dielectric layer is formed thereon. The second dielectric layer is deposited in the opening through the deposition process. Therefore, the whole process is simple, the size control and processing are convenient, and the shape precision and the formation quality of the first dielectric layer are improved.

In some possible embodiments, the first intermediate dielectric layer 25 and the second dielectric layer 30 may be formed by using a silicon epitaxial growth process. During the silicon epitaxial growth process of the first intermediate dielectric layer 25, the growth thickness of the first intermediate dielectric layer 25 can be flexibly controlled to provide a good process window for the subsequent processes.

When the second dielectric layer 30 is formed in the opening 50 through the silicon epitaxial growth process, the growth thickness of the second dielectric layer 30 can be controlled flexibly, such that a top surface of the second dielectric layer 30 is flush with that of the first intermediate dielectric layer 25. On the other hand, because the silicon epitaxy process can make the dielectric layer grow uniformly in the opening 50, a good tensile stress or compressive stress can be provided for the semiconductor structure to be formed, and the performance of the semiconductor structure is improved.

According to an exemplary embodiment, this embodiment is a further description of step S300 described above.

Figure 7:
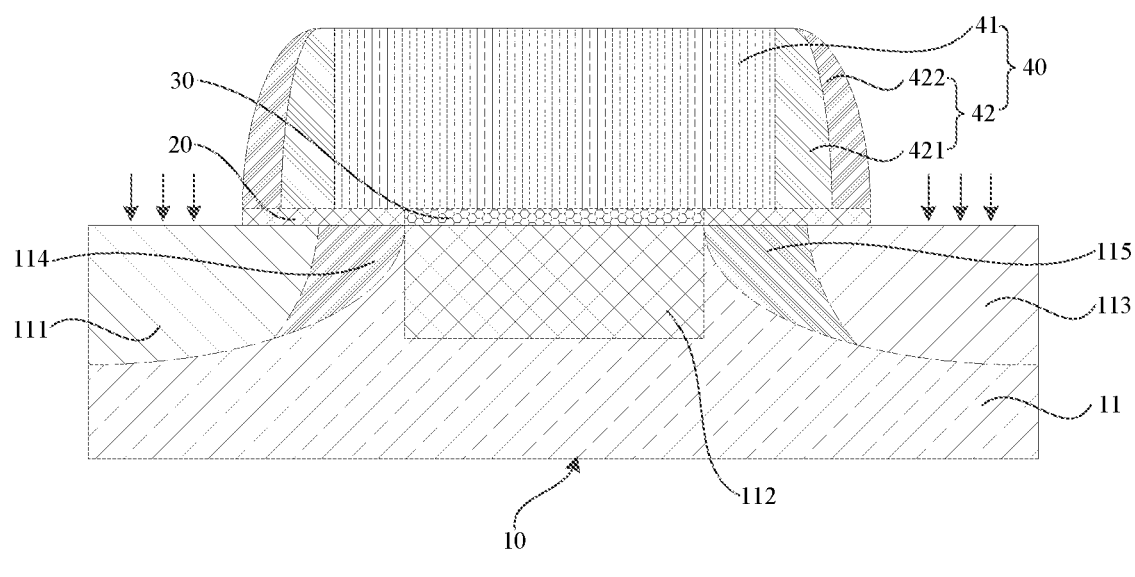
FIG. 7 is a schematic diagram of forming a gate structure in the method of manufacturing a semiconductor structure according to an exemplary embodiment.

As shown in FIG. 7, the gate structure 40 may be formed by using the following method:

First, a gate layer 41 is formed through the atomic layer deposition process, physical vapor deposition process, or chemical vapor deposition process. The material of the gate layer 41 may include, but is not limited to polysilicon, tungsten, titanium nitride, and the like. The gate layer 41 covers the second dielectric layer 30 and a part of the first intermediate dielectric layer 25.

Then, isolation layers 421 are formed on sidewalls of the gate layer 41 through a deposition process (for example, an atomic layer deposition process), and protective layers 422 are formed on sidewalls of the isolation layers 421 away from two sides of the gate layer 41.

In an example, the isolation layer 421 may be of a single-layer structure, to ensure the isolation function of the gate layer 41 and reduce the difficulty of the process.

Alternatively, the isolation layer 421 may be a laminated structure. For example, the isolation layer 421 includes a first isolation layer, a second isolation layer, and a third isolation layer (not shown in the figure). The three isolation layers may be made of a same material or not. For example, the materials of the three layers may include isolation materials such as silicon dioxide and a borophosphosilicate glass to isolate the gate layer 41. In another example, the first isolation layer, the second isolation layer and the third isolation layer may include silicon nitride or silicon oxynitride, to improve the isolation performance of the isolation layer 421 and facilitate selective etching in subsequent structures. Alternatively, the first isolation layer, the second isolation layer, and the third isolation layer may be made of a low-K material, and/or air gaps may be disposed in the first isolation layer, the second isolation layer, and the third isolation layer, to reduce the parasitic capacitance between the gate layer 41 and the side structure (for example, a contact plug).

The outer sidewalls of the isolation layer 421 and the protective layer 422 are arc-shaped, to improve the fault tolerance rate in the subsequent etching process and ensure the performance of the semiconductor structure.

The gate layer 41, the isolation layers 421, and the protective layers 422 form the gate structure 40.

In this embodiment, the isolation layer is configured to isolate the sidewall of the gate layer, and the protective layer protects the outer sidewall of the isolation layer and the gate layer, to avoid a damage on the gate layer caused by the processes such as the subsequent etching, thereby effectively ensuring the electrical property of the semiconductor structure.

According to an exemplary embodiment, this embodiment is a further description of step S400 described above.

An etching process is used to remove a part of the first intermediate dielectric layer 25 not covered by the gate structure 40, where a remaining part of the first intermediate dielectric layer 25 forms a first dielectric layer 20.

According to an exemplary embodiment, this embodiment is a further description of step S500 described above.

In some embodiments, as shown in FIG. 7, a source region of a first doping type and a drain region of the first doping type may be formed in the active region by using the following method:

Based on the outer sidewall of the protective layer 422, ions of the first doping type are doped into the substrate 10 through a self-alignment process, to form the source region 111 of the first doping type and the drain region 113 of the first doping type in the substrate 10 at two sides of the gate structure 40. The implantation method for doping ions into the substrate 10 may further include a first ion implantation and a second ion implantation. For example, in an example, the first source subregion 114 and the first drain subregion 115 are first formed in the substrate 10 at both sides of the gate structure 40 through the first ion implantation. Then, through the second ion implantation, the source region 111 of the first doping type is formed outside the first source subregion 114, and/or the drain region 113 of the first doping type is formed outside the first drain subregion 115. That is, the first source subregion 114 is located at one side of the source region 111 and close to the drain region 113, and the first drain subregion 115 is located at a side of the drain region 113 and close to the source region 111.

The first dielectric layer 20 is formed on a part of the source region 111; the first dielectric layer 20 is formed on a part of the drain region 113; or the first dielectric layer 20 is formed on a part of the source region 111 and a part of the drain region 113. The second dielectric layer 30 is connected to a side of the first dielectric layer 20 away from the source region 111 or the drain region 113.

In this embodiment, through the self-alignment process, ions are implanted into the substrate a plurality of times, to form the first source subregion and/or the first drain subregion. When the ion doping type of the first source subregion and/or the first drain subregion is opposite to those of the source region and drain region of the first doping type, the source-drain breakdown characteristics can be improved effectively. When the ion doping type of the first source subregion and/or the first drain subregion is the same as those of the source region and drain region of the first doping type, and is smaller than the ion dopant concentration of the source region and the drain region, The problem that the gate structure leaks a current is effectively resolved, thereby effectively ensuring the stability of the semiconductor structure.

According to an exemplary embodiment, this embodiment provides a method of manufacturing a semiconductor structure.

As shown in FIG. 8, the method of manufacturing a semiconductor structure includes:

Step S110: Provide a substrate, where an active region is provided in the substrate.

Step S210: Form a second initial dielectric layer, where the second initial dielectric layer covers a top surface of the substrate.

Step S310: Form a gate structure, and partially remove the second initial dielectric layer, where a remaining part of the second initial dielectric layer forms a second intermediate dielectric layer, and orthographic projection of the gate structure on the substrate coincides with orthographic projection of the second intermediate dielectric layer on the substrate.

Step S410: Partially remove the second intermediate dielectric layer, to form a filling groove, where the filling groove exposes a part of a bottom surface of the gate structure, and a remaining part of the second intermediate dielectric layer forms a second dielectric layer.

Step S510: Form a first dielectric layer in the filling groove, where projection of the first dielectric layer on the substrate at least partially overlaps that of the gate structure on the substrate, and a dielectric constant of the second dielectric layer is greater than that of the first dielectric layer.

Step S610: Form a source region of a first doping type and a drain region of the first doping type in the active region, where the first dielectric layer is formed on a part of the source region and/or a part of the drain region, and the second dielectric layer is connected to one side of the first dielectric layer away from the source region or the drain region.

In step S110, the active region 11 is disposed in the substrate 10. A plurality of active regions 11 are provided. The adjacent active regions 11 are separated by using a shallow trench isolation structure (not shown in the figure). A channel region 112 may be provided in each active region 11.

As shown in FIG. 9, in step S210, a second initial dielectric layer 60 is formed on the substrate 10 through an atomic layer deposition process, a physical vapor deposition process, or a chemical vapor deposition process. The second initial dielectric layer 60 covers the substrate 10. The dielectric constant of the material of the second initial dielectric layer 60 is greater than or equal to 3.9. For example, the material of the second initial dielectric layer 60 may be a high-K material.

According to an exemplary embodiment, this embodiment is a further description of step S310.

As shown in FIGS. 10 and 11, a gate structure 40 is formed on the second initial dielectric layer 60 through the atomic layer deposition process, the physical vapor deposition process, or the chemical vapor deposition process.

Then, a part of the second initial dielectric layer 60 is removed, and a remaining part of the second initial dielectric layer 60 forms a second intermediate dielectric layer (not shown in the figure). The orthographic projection of the gate structure 40 on the substrate 10 is equal to the orthographic projection of the second intermediate dielectric layer on the substrate 10.

The gate structure 40 may be formed by using the following method.

As shown in FIG. 10, a gate layer 41 is formed on the second initial dielectric layer 60 through the atomic layer deposition process, the physical vapor deposition process, or the chemical vapor deposition process. The material of the gate layer 41 may include, but is not limited to polysilicon, tungsten, titanium nitride, and the like.

With reference to FIG. 11, isolation layers 421 are formed on sidewalls of the gate layer 41 by using the atomic layer deposition process, the physical vapor deposition process, or the chemical vapor deposition process. The bottom of the isolation layer 421 may be connected to a partial top surface of the second initial dielectric layer 60. A material of the isolation layer 421 may include, but is not limited to, a low-K material, silicon dioxide, borophosphosilicate glass, silicon nitride, silicon oxynitride, and the like. An air gap may be also formed in the isolation layer 421. Then, protective layers 422 are formed on the sidewalls of the isolation layers 421 away from the gate layer 41 by using a deposition process (for example, an atomic layer deposition process). The protective layer 422 and the isolation layer 421 form a protection structure 42. The protection structure 42 and the gate layer 41 form the gate structure 40.

In this embodiment, the isolation layer is configured to effectively isolate the sidewall of the gate layer, and the protective layer protects the outer sidewall of the isolation layer and the gate layer well, to avoid a damage on the gate layer caused by the processes such as the subsequent etching, thereby effectively ensuring the electrical property of the semiconductor structure.

As shown in FIG. 11, in step S410, a part of the second intermediate dielectric layer is removed through an etching process, to hollow out the bottom of the gate structure 40, and form a filling groove 70, thereby forming a first dielectric layer 20 subsequently. The filling groove 70 exposes the bottom surface of the protection structure 42, and a remaining part of the second intermediate dielectric layer forms the second dielectric layer 30. It should be noted that the filling groove 70 may be formed at one side of the second dielectric layer 30, or may be formed at each of two sides of the second dielectric layer 30.

According to an exemplary embodiment, this embodiment is a further description of step S510.

Figure 12:
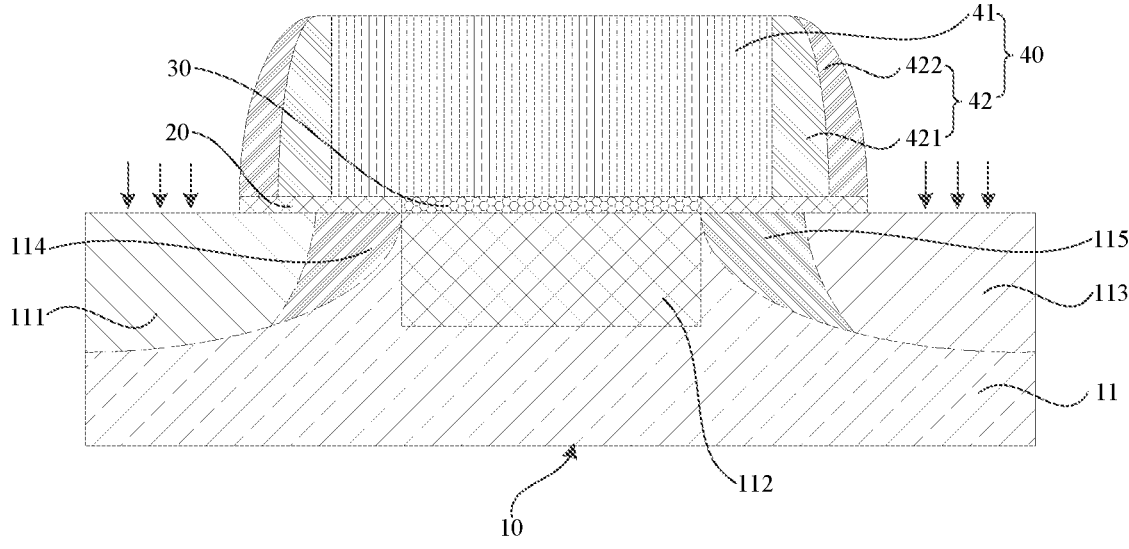
FIG. 12 is a schematic diagram of forming a first dielectric layer in the method of manufacturing a semiconductor structure according to an exemplary embodiment.

As shown in FIGS. 11 and 12, in some embodiments, the first dielectric layer 20 may be formed by using the following method:

In an example, a first dielectric layer 20 is formed in the filling groove 70 through the atomic layer deposition process, physical vapor deposition process, or chemical vapor deposition process. The first dielectric layer 20 is connected to the second dielectric layer 30 and is located between the substrate 10 and the gate layer 41. The dielectric constant of the material of the first dielectric layer 20 is smaller than or equal to 3. For example, the material of the first dielectric layer 20 may include low-K materials, such as silicon nitride and silicon nitride carbide.

In this embodiment, the dielectric constant of the first dielectric layer is compared with the dielectric constant of the second dielectric layer, or the dielectric constant of the second dielectric layer is smaller than the dielectric constant of the dielectric layer in the related art, thereby effectively reducing a parasitic capacitance of an overlapping region between the gate layer and the source region and/or a parasitic capacitance of an overlapping region between the gate layer and the drain region, minimizing the time for the semiconductor structure to read data, and improving the electrical property of the semiconductor structure.

Figure 13:
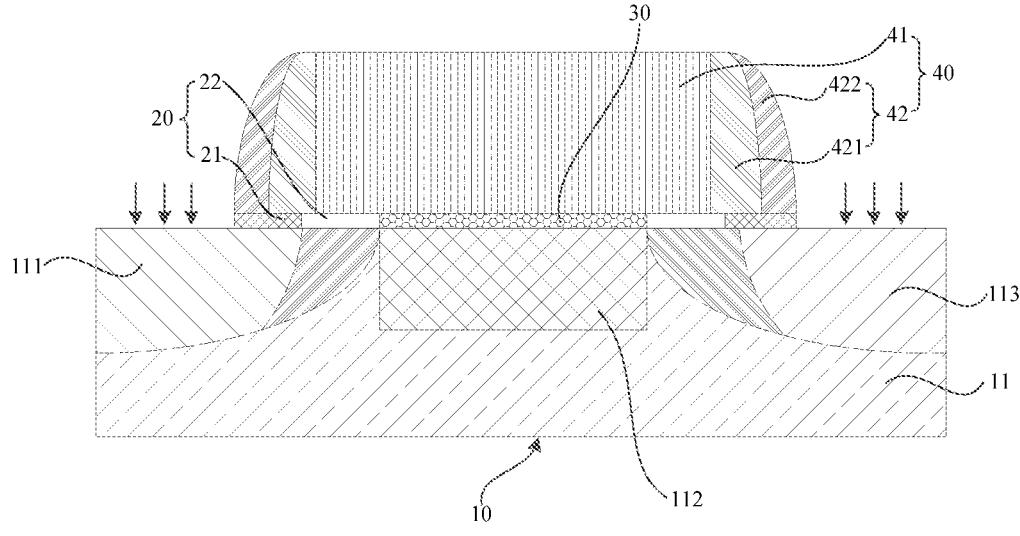
FIG. 13 is a schematic diagram of forming the first dielectric layer in the method of manufacturing a semiconductor structure according to an exemplary embodiment.

In another example, with reference to FIG. 13, a first dielectric sublayer 21 is formed in the filling groove 70 through the atomic layer deposition process, physical vapor deposition process, or chemical vapor deposition process. The first dielectric sublayer 21 does not fill up the filling groove 70 (with reference to FIG. 13). The orthographic projection of the first dielectric sublayer 21 on the substrate 10 is smaller than the orthographic projection of the protection structure 42 on the substrate 10, such that an air gap 22 is formed between the first dielectric sublayer 21 and the second dielectric layer 30. The outer sidewall of the first dielectric sublayer 21 is flush with the outer sidewall of the protection structure 42. The first dielectric sublayer 21 and the air gap 22 form the first dielectric layer 20. The dielectric constant of the material of the first dielectric sublayer 21 is smaller than or equal to 3. For example, the material of the first dielectric sublayer 21 may include low-K materials, such as silicon nitride and silicon nitride carbide.

In this embodiment, an air gap is arranged on the outer edge of the second dielectric layer, and a first dielectric layer is arranged on the outer edge of the air gap. The dielectric constant of the first dielectric layer is smaller than that of the second dielectric layer, and the dielectric constant of the air gap is 1, thereby effectively reducing a parasitic capacitance of an overlapping region between the gate layer and the source region and/or a parasitic capacitance of an overlapping region between the gate layer and the drain region, minimizing the time for the semiconductor structure to read data, and improving the electrical property of the semiconductor structure.

According to an exemplary embodiment, this embodiment is a further description of step S610.

In some embodiments, as shown in FIGS. 12 and 13, a source region of a first doping type and a drain region of the first doping type may be formed in the active region by using the following method:

Based on the outer sidewall of the protective layer 422, ions of the first doping type are doped into the substrate 10 through a self-alignment process, to form the source region 111 of the first doping type and the drain region 113 of the first doping type in the substrate 10 at two sides of the gate structure 40. The implantation method for doping ions of the first doping type into the substrate 10 may include a first ion implantation and a second ion implantation. For example, in an example, the first source subregion 114 and the first drain subregion 115 are first formed in the substrate 10 at both sides of the gate structure 40 through the first ion implantation. Then, through the second ion implantation, the source region 111 of the first doping type is formed outside the first source subregion 114, and/or the drain region 113 of the first doping type is formed outside the first drain subregion 115. That is, the first source subregion 114 is located at one side of the source region 111 and close to the drain region 113, and the first drain subregion 115 is located at a side of the drain region 113 and close to the source region 111.

The first dielectric layer 20 is formed on a part of the source region 111; the first dielectric layer 20 is formed on a part of the drain region 113; or the first dielectric layer 20 is formed on a part of the source region 111 and a part of the drain region 113. The second dielectric layer 30 is connected to a side of the first dielectric layer 20 away from the source region 111 or the drain region 113.

In this embodiment, through the self-alignment process, ions are implanted into the substrate a plurality of times, to form the first source subregion and/or the first drain subregion. When the ion doping type of the first source subregion and/or the first drain subregion is opposite to those of the source region and drain region of the first doping type, the source-drain breakdown characteristics can be improved effectively. When the ion doping type of the first source subregion and/or the first drain subregion is the same as those of the source region and drain region of the first doping type, and is smaller than the ion dopant concentration of the source region and the drain region, The problem that the gate structure leaks a current is effectively resolved, thereby effectively ensuring the stability of the semiconductor structure.

In the semiconductor structure and a manufacturing method thereof provided by the embodiments of the present disclosure, the dielectric layer includes a first dielectric layer and a second dielectric layer that are connected to each other. The first dielectric layer covers a part of the source region and/or a part of the drain region. The second dielectric layer is disposed on the substrate and connected to the first dielectric layer. The orthographic projection of the gate structure on the substrate covers the orthographic projection of the second dielectric layer and the orthographic projection of the first dielectric layer on the substrate. In this case, the dielectric constant of the second dielectric layer is greater than that of the first dielectric layer, thereby reducing a parasitic capacitance of an overlapping region between the gate structure and the source region and/or a parasitic capacitance of an overlapping region between the gate structure and the drain region, minimizing time for the semiconductor structure to read data, and improving the electrical property of the semiconductor structure.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure.

Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A semiconductor structure, comprising:
   a substrate, wherein an active region is provided in the substrate, and a source region of a first doping type and a drain region of the first doping type are disposed in the active region;
   a first dielectric layer, disposed on the substrate and covering at least one of a part of the source region or a part of the drain region;
   a second dielectric layer, disposed on the substrate, wherein the first dielectric layer is connected to the second dielectric layer, and a dielectric constant of the second dielectric layer is greater than a dielectric constant of the first dielectric layer; and
   a gate structure, wherein orthographic projection of the gate structure on the substrate covers orthographic projections of the second dielectric layer and the first dielectric layer on the substrate;
   the gate structure comprises a gate layer, the gate layer is disposed on the second dielectric layer, and an overlapping region exists between projection of the gate layer on the substrate and the projection of the first dielectric layer on the substrate;
   the first dielectric layer comprises a first dielectric sublayer and an air gap, at least part of the air gap is located below the gate layer, and the air gap is located between the first dielectric sublayer and the second dielectric layer.

2. The semiconductor structure according to claim 1, wherein
   the dielectric constant of the first dielectric layer is smaller than or equal to 3.

3. The semiconductor structure according to claim 1, wherein
   the dielectric constant of the second dielectric layer is greater than or equal to 3.9.

4. The semiconductor structure according to claim 1, wherein
   the first dielectric layer is as thick as the second dielectric layer.

5. The semiconductor structure according to claim 1, wherein
   the gate structure further comprises protection structures; and
   the protection structures are disposed at two sides of the gate layer, and cover side surfaces of the gate layer.

6. The semiconductor structure according to claim 5, wherein
   each of the protection structures comprises an isolation layer and a protective layer;
   the isolation layer is disposed on a sidewall of the gate layer; and
   the protective layer is disposed on a sidewall of the isolation layer, and is away from the gate layer.

7. The semiconductor structure according to claim 1, wherein
   the substrate further comprises a channel region of a second doping type, the channel region is disposed below the gate structure, and is connected to the source region and the drain region, and the second dielectric layer covers a top surface of the channel region.

8. The semiconductor structure according to claim 1, wherein the substrate further comprises at least one of a first source subregion of the first doping type or a first drain subregion of the first doping type, the first source subregion is located at one side of the source region and close to the drain region, the first drain subregion is located at one side of the drain region and close to the source region, a dopant ion concentration of the first source subregion is smaller than a dopant ion concentration of the source region, and a dopant ion concentration of the first drain subregion is smaller than a dopant ion concentration of the drain region.

* * * * *